United States Patent [19]

Henderson et al.

[11] Patent Number: 4,868,516
[45] Date of Patent: Sep. 19, 1989

[54] ALTERNATING CURRENT AMPLIFIER WITH DIGITALLY CONTROLLED FREQUENCY RESPONSE

[75] Inventors: Robert M. Henderson; Leslie L. Szepesi, both of Everett, Wash.

[73] Assignee: John Fluke Mfg. Co., Inc., Everett, Wash.

[21] Appl. No.: 182,564

[22] Filed: Apr. 14, 1988

[51] Int. Cl.[4] .............................................. H03F 1/34
[52] U.S. Cl. .......................................... 330/86; 330/2; 330/107
[58] Field of Search ................. 330/86, 107, 282, 294, 330/2; 307/520; 328/167, 128

[56] References Cited

U.S. PATENT DOCUMENTS 4,481,466 11/1984 Roos et al. ....................... 328/128 X

FOREIGN PATENT DOCUMENTS 2190255 11/1987 United Kingdom ................ 328/167

OTHER PUBLICATIONS

Allstot et al., "An Electrically-Programmable Switched Capacitor Filter", *IEEE J. of Solid-State Circuits*, vol. SC-14, No. 6, Dec. 1979, pp. 1034–1041.
Bruton et al., "Time-Multiplexed Active Filters", *IEEE J. of Solid-State Circuits*, vol. SC-7, No. 3, Jun. 1972, pp. 259–265.

*Primary Examiner*—James B. Mullins
*Attorney, Agent, or Firm*—George T. Noe; George B. Fox

[57] ABSTRACT

An improved alternating current amplifier employs capacitive feedback to balance the intrinsic input capacitance, and a multiplier circuit responsive to a digital control signal coupled in the feedback path to vary the effective capacitance of the capacitive feedback. Thus, the frequency response of the amplifier may be adjusted and set digitally, such as under computer control, obviating the need to make manual adjustments to improve amplifier performance.

22 Claims, 2 Drawing Sheets

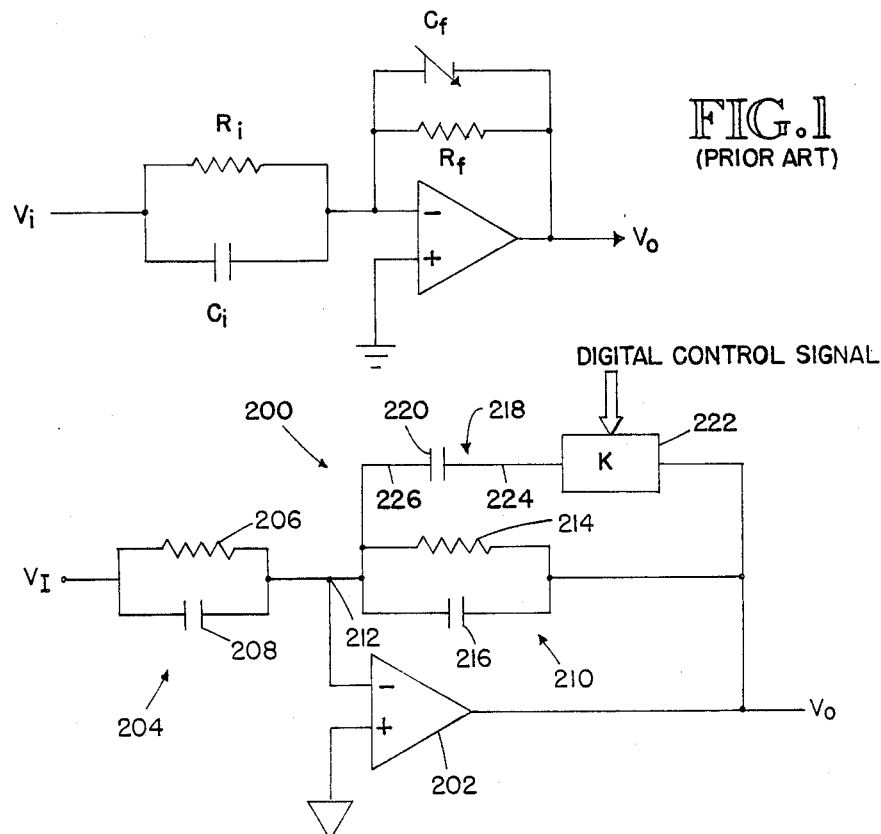

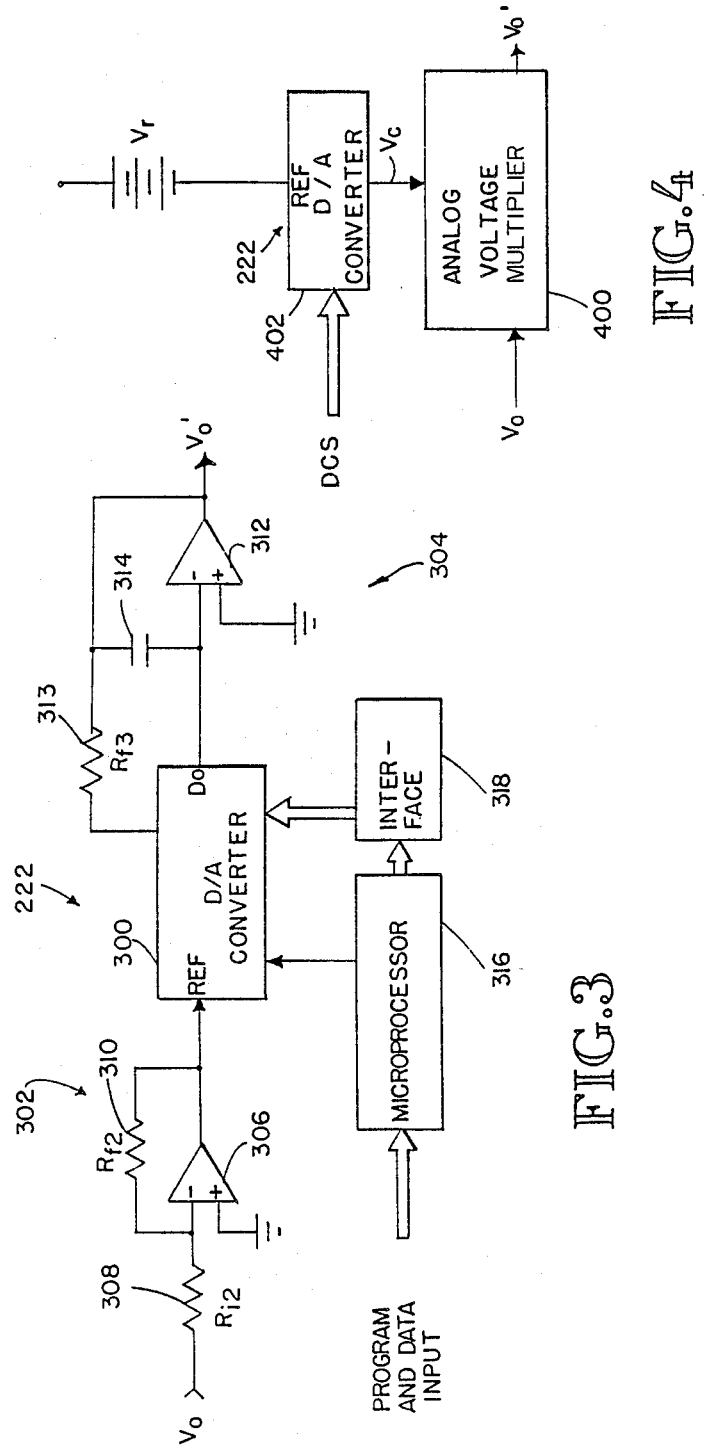

ALTERNATING CURRENT AMPLIFIER WITH DIGITALLY CONTROLLED FREQUENCY RESPONSE

DESCRIPTION

1. Technical Field

The present invention is directed toward alternating current amplifiers and, more particularly, toward method and apparatus for digitally controlling the frequency response of an alternating current amplifier.

2. Background of the Invention

Generally, amplifier circuits receive a voltage input and provide a voltage output which is proportional to the received input voltage. In very low frequency applications (including direct current DC applications) the proportionality factor (otherwise referred to as gain) of the amplifier can be selected by proper choice of the input and feedback resistors. However, in high frequency applications, parasitic and other capacitance alters the gain of the amplifier. The particular manner in which the amplifier gain is altered is commonly referred to as the frequency response of the amplifier.

It is typically desirable to minimize any change in gain of the amplifier which may occur as a result of a change in the input voltage frequency, i.e., it is desirable to control the frequency response of the amplifier. One prior art method for controlling the frequency response of an amplifier circuit is shown in FIG. 1.

The amplifier of FIG. 1 includes an input resistor $R_i$ and a feedback resistor $R_f$ such that the low frequency response of the amplifier can be expressed as:

$$V_O = -V_i (R_f/R_i).$$

At high frequency, the parasitic capacitance (represented as $C_i$) alters the gain of the amplifier. Accordingly, a feedback capacitor has been added in parallel with the feedback resistor to balance the effect of the parasitic input capacitance $C_i$. The feedback capacitor is varied to minimize the effect of the parasitic capacitance $C_i$ on the amplifier gain. As illustrated in FIG. 1, the capacitor is manually variable, i.e., must be varied by a user to balance the input parasitic capacitance.

The above-described prior art circuit eliminates the possibility of computer controlled frequency response or computer controlled calibration. Also, the above-described prior art circuit requires manual adjustment of the variable capacitor and thus requires "open cover calibration." That is to say, any device in which the above-described prior art circuit is utilized must be calibrated by removing the cover thereof, thereby exposing the device to hazards which may result from the open cover architecture. Further, other prior art methods suffer from additional disadvantages such as, for example, large temperature coefficients of capacitance and nonlinearity of adjustment mechanisms.

Accordingly, it is desirable to provide method and apparatus for digitally controlling the frequency response of an alternating current amplifier thereby allowing precise control over the response of the amplifier at high frequency and further allowing "closed cover calibration" of the amplifier.

DISCLOSURE OF THE INVENTION

The present invention provides an improved alternating current amplifier wherein the frequency response may be digitally controlled. The amplifier comprises a voltage amplifier circuit for receiving an input voltage and providing an output voltage which is proportional to the received input voltage by a predetermined amplifier constant. The amplifier further includes a variable capacitor circuit for varying the effective feedback capacitance of the voltage amplifier circuit, in response to a digital input signal, to balance the input capacitance to the voltage amplifier circuit.

The variable capacitor circuit comprises a fixed capacitor and a voltage multiplier. The voltage multiplier has a multiplier input coupled to receive the output from the voltage amplifier circuit. The voltage multiplier is further responsive to a digital input signal to provide an output voltage which is proportional to the voltage present at the multiplier input by a selectable constant. The digital input signal is a binary representation of the selected constant.

The present invention further includes a method for balancing the input capacitance of a voltage amplifier circuit of the type which includes an operational amplifier having a feedback impedance coupled intermediate the output of the voltage amplifier and a summing node. The method comprises the step of providing a fixed capacitor which has a capacitance that is not equal to the input capacitance. The fixed capacitor which is provided has an input terminal and an output terminal. The method further includes the step of multiplying the output voltage of the operational amplifier by a selectable constant K and providing the multiplied output voltage to the input terminal of the fixed capacitor. Lastly, the method includes the step of coupling the output terminal of the fixed capacitor to the summing node such that the effective capacitance of the amplifier feedback impedance is proportional to the selectable constant K.

BRIEF DESCRIPTION OF THE DRAWINGS

FIG. 1 is an illustrative schematic diagram of a prior art alternating current voltage amplifier.

FIG. 2 is an illustrative schematic diagram of the alternating current voltage amplifier with a digitally controlled frequency response that is the subject of the present invention.

FIG. 3 is an illustrative block diagram of the voltage multiplier illustrated in FIG. 2.

FIG. 4 is an alternative embodiment of the voltage multiplier illustrated in FIG. 2.

BEST MODE FOR CARRYING OUT THE INVENTION

The present invention comprises an improved alternating current amplifier having a digitally controlled frequency response. A schematic diagram of a circuit which comprises the present invention is illustrated in FIG. 2. Therein, an alternating current amplifier 200 comprises an operational amplifier 202 coupled to receive an input voltage $V_i$ via an input impedance 204. The input impedance 204 includes an input resistor 206 having a resistance value equal to $R_i$. As is known in the art, the input resistor 206 includes a parasitic capacitance 208 having a value equal to $C_i$, which value is a function of the physical characteristics of the resistor 206 in addition to the manner in which the resistor is coupled to the AC amplifier 200. Typically, the parasitic capacitance may be in the picofarad range.

It will be appreciated by those skilled in the art that although the invention is shown and described by reference to a parasitic input capacitance 208, the invention is equally applicable to circuits wherein a capacitor is added to the input impedance 204.

The AC amplifier 200 further includes a feedback impedance 210 coupled intermediate the output $V_O$ of the amplifier 200 and a summing node 212. The feedback impedance 210 comprises a feedback resistor 214 coupled in parallel with a feedback capacitor 216. The value $R_f$ of the feedback resistor 214 is chosen in conjunction with the value $R_i$ of the input resistor 206 to provide the low frequency gain of the amplifier which may be represented as:

$$V_O = -V_i(R_f/R_i)$$

or $$V_O = -V_i(A)$$

where A is the DC gain of the amplifier. The value $C_{f1}$ of the capacitor 216 is chosen to roughly approximate the value of the parasitic capacitor 208. However, it is important that the value of the feedback capacitor 216 be either greater or less than the value of the parasitic capacitor 208 divided by the DC gain A of the amplifier. In the presently preferred embodiment, the value $C_{f2}$ of the feedback capacitor 216 is chosen to be less than the value $C_i$ of the parasitic capacitor 208 divided by the DC gain of the amplifier A, i.e.:

$$C_{f1} < C_i/A.$$

The novel alternating current amplifier 200 also includes a variable capacitor circuit 218 coupled intermediate the output $V_O$ of the amplifier 200 and the summing node 212. The variable capacitor circuit includes a fixed capacitor 220 and a voltage multiplier 222. The voltage multiplier 222 is responsive to a digital control signal to multiply the output voltage $V_O$ by a selectable constant K. The multiplied output voltage is provided to a first terminal 224 of the fixed capacitor 220. A second terminal 226 of the fixed capacitor 220 is coupled to the summing node 212. By multiplying the output voltage $V_O$ by the selectable constant K, the effective capacitance $C_{eff}$ of the fixed capacitor 220 can be altered, particularly:

$$C_{eff} = K(C_{f2}).$$

selection of K within the range:

$$0 < K < 1$$

allows the effective capacitance of the fixed capacitor 220 to be decreased thus decreasing the total feedback capacitance. Accordingly, it is necessary that the values of the feedback capacitor 216 and the fixed capacitor 220 be chosen such that the uncompensated feedback is greater than the parasitic capacitance divided by the DC gain, i.e.:

$$C_f + C_{f2} > C_i/A.$$

The voltage multiplier 222 may be implemented with a number of devices. One presently preferred embodiment of the voltage multiplier 222 is shown in FIG. 3. Therein, the voltage multiplier comprises a standard digital-to-analog (D/A) converter 300 coupled to an input amplifier 302 and an output amplifier 304. The input amplifier comprises a standard operational amplifier circuit including an operational amplifier 306 having an input resistor 308 and a feedback resistor 310. The input amplifier 302 is provided for scaling the input $V_O$ to the voltage multiplier 222 by a predetermined scaling factor equal to the ratio of the value $R_{i2}$ of the input resistor 308 and the value $R_{f2}$ of the feedback resistor 310, i.e., $(R_{f2}/R_{i2})$. The output from the input amplifier 302 is coupled to the reference voltage input of the D/A converter 300.

The output amplifier 304 also comprises an operational amplifier circuit including an operational amplifier 312 having a feedback path which includes a feedback capacitor 314 and feedback resistor 313. The operational amplifier circuit of the output amplifier 304 is constructed to have an output voltage to current input ratio equal to $R_{f3}$, the value of the resistor 313. The output amplifier 304 is provided for converting the variable current output of D/A converter 300 to a variable voltage output $V_O'$. The output from the output amplifier 304 is provided to the first terminal 224 of the fixed capacitor 220.

The voltage multiplier 220 is controlled by a digital control signal which is provided to the D/A converter 300 by a microprocessor 316 via an interface 318. The D/A converter provides an output signal at its data output (DO) which is a multiple of the voltage present at its reference input and the binary value of the digital control signal.

The block diagram of FIG. 3 further illustrates the manner in which closed cover calibration of the improved amplifier circuit is performed. The microprocessor 316 responds to program and data input to provide the digital control signal (DCS) to the D/A converter 300 via an interface 318. The interface may comprise buffer memory, e.g., latches, in addition to other interface and control circuitry as is known in the art. By multiplying the reference voltage by the binary value of the digital control signal, the D/A converter 300, in combination with the output amplifier 304, provides an output voltage $V_O'$ which is a binary multiple of the output $V_O$ of the amplifier 200 and the constant K. It will be apparent to those skilled in the art that the digital control signal must compensate for the scaling factor of the input amplifier 302, or, put another way, the value of the gain K of the voltage multiplier 222 is a function of the binary value of the digital control signal and the scaling factor of the input amplifier 302.

During calibration, the digital control signal is varied until the frequency response of the amplifier 200 is within an acceptable tolerance. The amplifier 200 may thereafter be calibrated at any varying interval to maintain its frequency response within the desired tolerance. As an example, calibration may be desired, and provided, as often as every hour of use. Since control may be digitally accomplished by altering the control program and data of microprocessor 316, repeated calibration may be performed easily, quickly and without removing the cover of the device in which the amplifier is utilized.

An alternative embodiment for the voltage multiplier 222 is shown in FIG. 4. Therein, an analog voltage multiplier circuit 400 is coupled to a digital-to-analog D/A converter 402 for receiving a control voltage therefrom. The D/A converter 402 is responsive to the digital control signal to provide an output voltage $V_c$ which is proportional to the value of the reference voltage $V_r$ and the binary value of the digital control signal.

The analog multiplier circuit 400 provides an output voltage V01 which is proportional to the voltage multiplier circuit input voltage $V_O$ and the control voltage $V_c$. Like the circuit of FIG. 3, the circuit at FIG. 4 allows for digital control of the voltage $V_{01}$ and hence digital control of the effective capacitance of the amplifier circuit 200.

It will be appreciated that, although specific embodiments of the invention have been described herein for purposes of illustration, various modifications may be made without departing from the spirit and scope of the invention. Accordingly, the invention is not limited except as by the appended claims.

We claim:

1. An improved alternating current amplifier comprising:
    an operational amplifier having first and second operational amplifier inputs and an operational amplifier output, said operational amplifier being constructed to provide a voltage at said operational amplifier output which is proportional to the difference between the voltages present at said first and second operational amplifier inputs, said second operational amplifier input being coupled to a reference voltage;
    input impedance means for coupling an input voltage to said first operational amplifier input, said input impedance means including an input capacitance;
    feedback impedance means, coupled intermediate said operational amplifier output and said first operational amplifier input, for providing an impedance in the feedback path of said operational amplifier, said feedback impedance means including a feedback resistor coupled in parallel with a feedback capacitor; and
    variable capacitor means for balancing the feedback capacitance with the input capacitance, said variable capacitor means being coupled in parallel with said feedback impedance means and including a serially coupled fixed capacitor and voltage multiplier, said voltage multiplier having a multiplier input coupled to receive said operational amplifier output and being responsive to a digital control signal to provide an output voltage which is proportional to the voltage present at said multiplier input by a selectable constant, the selectable constant being a function of the binary value of the digital control signal.

2. An amplifier as recited in claim 1 wherein said voltage multiplier comprises digital to analog (D/A) converter means for providing an output voltage which is proportional to the voltage present at the input to said digital to analog (D/A) converter means, said digital to analog (D/A) converter means including a digital to analog (D/A) converter having a reference voltage input and being responsive to the digital control signal for providing an output voltage which is a product of a constant and the voltage present at said reference voltage input, the constant being a function of the binary representation of the digital control signal.

3. An amplifier as recited in claim 2 wherein said digital to analog (D/A) converter means further comprises an input amplifier which scales the input voltage to said digital to analog (D/A) converter, said input amplifier being coupled to receive the voltage from said operational amplifier output as its input signal and being coupled to provide its scaled output to the reference voltage input of said digital to analog (D/A) converter.

4. An amplifier as recited in claim 3 wherein said input amplifier comprises an inverting operational amplifier circuit including an input resistor of 23 kilohms and a feedback resistor of 10 kilohms to have a negative gain G wherein $G=(1/2.3)$.

5. An amplifier as recited in claim 3 wherein said digital to analog (D/A) converter means further comprises an output amplifier which converts a variable output current to a corresponding variable output voltage, said output amplifier being coupled to receive the converted output from said digital to analog (D/A) converter and to provide its variable voltage output to said fixed capacitor.

6. An amplifier as recited in claim 5 wherein said output amplifier comprises an operational amplifier circuit constructed with a output voltage to input current ratio.

7. An amplifier as recited in claim 3 wherein said input impedance comprises an input resistor which includes a parasitic capacitance, said input resistor and said feedback resistor being selected to provide a predetermined low frequency gain to the improved amplifier.

8. An amplifier as recited in claim 2 wherein said digital to analog (D/A) converter means further comprises an output amplifier which converts a variable output current to a corresponding variable output voltage, said output amplifier being coupled to receive the converted output from said digital to analog (D/A) converter and to provide its variable voltage output to said fixed capacitor.

9. An amplifier as recited in claim 2 wherein said input impedance comprises an input resistor which includes a parasitic capacitance, said input resistor and said feedback resistor being selected to provide a predetermined low frequency gain to the improved amplifier.

10. An amplifier as recited in claim 1 wherein said input impedance comprises an input resistor which includes a parasitic capacitance, said input resistor and said feedback resistor being selected to provide a predetermined low frequency gain to the improved amplifier.

11. An amplifier as recited in claim 1 wherein said input impedance comprises an input resistor and an input capacitance, said input resistor and said feedback resistor being selected to provide a predetermined low frequency gain to the improved amplifier.

12. A method for balancing the input capacitance of a voltage amplifier circuit of the type which includes an operational amplifier having a feedback impedance coupled intermediate the output of the voltage amplifier and a summing node, said method comprising the steps of:
    providing a fixed capacitor having a capacitance which is not equal to the input capacitance, the fixed capacitor having an input terminal and an output terminal;
    coupling the output terminal of the fixed capacitor to the summing node;
    multiplying the output voltage of the operational amplifier by a selectable constant K wherein the selectable constant K is a function of the binary value of a digital control word; and
    providing the multiplied output voltage to the input terminal of the fixed capacitor such that the effective capacitance of the amplifier feedback impedance is proportional to the selectable constant K.

13. The method as recited in claim 12 further comprising the step of periodically calibrating the voltage amplifier circuit by varying the digital control word until an acceptable frequency response is provided by the voltage amplifier circuit.

14. An improved alternating current amplifier comprising:
   voltage amplifier means for receiving an input voltage and providing an output voltage which is proportional to the received input voltage by a predetermined amplifier constant; and
   variable capacitance means for varying the capacitance of said voltage amplifier means, said variable capacitance means comprising voltage multiplier means serially coupled to a fixed capacitor, said fixed capacitor being coupled to the input voltage of said voltage amplifier means, said voltage multiplier means having a multiplier input coupled to receive said voltage amplifier means output and being responsive to a digital control signal to provide an output voltage which is proportional to the voltage present at said voltage multiplier means input by a selectable constant, the selectable constant being a function of the binary value of the digital control signal.

15. An amplifier as recited in claim 14 wherein said voltage multiplier means comprises a digital to analog (D/A) converter including a digital input coupled to receive the digital control signal, a reference voltage input coupled to receive the output of said voltage amplifier means and a digital to analog (D/A) converter output coupled to said fixed capacitor.

16. An amplifier as recited in claim 15 wherein said voltage multiplier means further comprises an input amplifier having a predetermined gain, said input amplifier being coupled intermediate said voltage amplifier means output and said reference voltage input such that the selectable constant is a function of the binary value of the digital control signal and the predetermined gain of said input amplifier.

17. An amplifier as recited in claim 16 wherein said voltage multiplier means further comprises an output amplifier having a preselected gain, said output amplifier being coupled intermediate said digital to analog (D/A) converter output and said fixed capacitor such that the selectable constant is a function of the binary value of the digital control signal, the predetermined gain of said input amplifier and the preselected gain of said output amplifier.

18. An amplifier as recited in claim 15 wherein said voltage multiplier means further comprises an output amplifier having a preselected gain, said output amplifier being coupled intermediate said digital to analog (D/A) converter output and said fixed capacitor such that the selectable constant is a function of the binary value of the digital control signal and the preselected gain of said output amplifier.

19. An amplifier as recited in claim 15 further comprising microprocessor means coupled to said digital to analog (D/A) converter digital input and responsive to user provided program and data input for providing the digital control signal.

20. An amplifier as recited in claim 14 wherein said variable capacitor means comprises:
   a fixed capacitor having first and second terminals, said first terminal being coupled to the input of said voltage amplifier means;
   a voltage multiplier including a first voltage input coupled to receive a control voltage, a second voltage input coupled to receive said voltage amplifier means output and a voltage output serially coupled to said fixed capacitor, said voltage multiplier providing an output voltage which is a product of the voltage present at said first and second inputs; and
   a digital to analog (D/A) converter including a reference voltage input coupled to a constant reference voltage, a voltage output coupled to provide the control voltage and a digital input coupled to receive the digital control signal, said digital to analog (D/A) converter providing a control voltage which is a product of the reference voltage and the binary value of the digital control signal.

21. An amplifier as recited in claim 14 further comprising microprocessor means coupled to said variable capacitor means and responsive to user provided program and data input for providing the digital control signal.

22. An amplifier as recited in claim 14 further comprising microprocessor means coupled to said voltage multiplier means and responsive to user provided program and data input for providing the digital control signal.

* * * * *